US011152375B2

(12) United States Patent
Kim (10) Patent No.: US 11,152,375 B2
(45) Date of Patent: Oct. 19, 2021

(54) CONTACT PATTERNING

(71) Applicant: Micron Technology, Inc., Boise, ID (US)

(72) Inventor: Byung Yoon Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 47 days.

(21) Appl. No.: 16/259,330

(22) Filed: Jan. 28, 2019

(65) Prior Publication Data
US 2020/0243540 A1    Jul. 30, 2020

(51) Int. Cl.
| H01L 27/108 | (2006.01) |
| H01G 4/008 | (2006.01) |
| H01G 4/08 | (2006.01) |
| H01G 4/012 | (2006.01) |
| H01L 21/02 | (2006.01) |

(52) U.S. Cl.
CPC ....... *H01L 27/10894* (2013.01); *H01G 4/008* (2013.01); *H01G 4/012* (2013.01); *H01G 4/08* (2013.01); *H01L 21/02123* (2013.01); *H01L 27/10805* (2013.01); *H01L 27/10852* (2013.01)

(58) Field of Classification Search
CPC ......... H01L 27/10882; H01L 27/10885; H01L 27/10888; H01L 27/10891
See application file for complete search history.

(56) References Cited

U.S. PATENT DOCUMENTS

| 6,291,846 B1* | 9/2001 | Ema | H01L 27/10852 257/206 |
| 6,359,301 B1* | 3/2002 | Kuroda | H01L 21/32053 257/306 |
| 7,662,693 B2 | 2/2010 | Bhattacharyya | |
| 7,875,529 B2 | 1/2011 | Forbes et al. | |
| 7,875,733 B2 | 1/2011 | Forbes et al. | |
| 8,274,777 B2 | 9/2012 | Kiehlbauch | |
| 8,779,546 B1* | 7/2014 | Tsukamoto | H01L 27/10888 257/506 |
| 2005/0218440 A1* | 10/2005 | Park | H01L 27/10888 257/298 |
| 2010/0270647 A1* | 10/2010 | Cho | H01L 28/91 257/532 |
| 2010/0327407 A1* | 12/2010 | Kang | H01L 27/10894 257/532 |

(Continued)

OTHER PUBLICATIONS

Hwang etal, "Smallest Bit-Line Contact of 76nm pitch on NAND Flash Cell by using Reversal PR (Photo Resist) and SADP (Self-Align Double Patterning) Process", IEEE (2007): pp. 1-3. (Year: 2007).*

*Primary Examiner* — Michele Fan
(74) *Attorney, Agent, or Firm* — Brooks, Cameron & Huebsch, PLLC (57) ABSTRACT

Methods, apparatuses, and systems related to patterning a material over a sense line contact are described. An example method includes forming a sense line contact pattern at an angle to a sense line direction over semiconductor structures on a substrate, wherein the angle to the sense line direction is formed along a path between a sense line contact in a first sense line column and a sense line contact in a second sense line column. The example method further includes removing a portion of a mask material corresponding to the sense line contact pattern to form sense line contacts.

13 Claims, 10 Drawing Sheets

(56) References Cited

U.S. PATENT DOCUMENTS

| | | | |
|---|---|---|---|
| 2011/0149655 A1* | 6/2011 | Tanzawa | G11C 16/0483 |
| | | | 365/185.17 |
| 2013/0248798 A1* | 9/2013 | Yi | H01L 45/04 |
| | | | 257/2 |
| 2015/0340453 A1* | 11/2015 | Cho | H01L 29/423 |
| | | | 257/330 |
| 2016/0056159 A1* | 2/2016 | Kim | H01L 21/76879 |
| | | | 257/532 |
| 2016/0181316 A1* | 6/2016 | Lee | H01L 27/222 |
| | | | 711/125 |

\* cited by examiner

┌─────────────────────────────────────────────────────────┐
│ FORMING A SENSE LINE CONTACT PATTERN AT AN ANGLE TO A   │
│ SENSE LINE DIRECTION OVER SEMICONDUCTOR STRUCTURES ON   │
│ A SUBSTRATE, WHEREIN THE ANGLE TO THE SENSE LINE        │─ 734
│ DIRECTION IS ALONG A PATH BETWEEN AN ACTIVE AREA FOR    │
│ A SENSE LINE CONTACT IN A FIRST SENSE LINE COLUMN AND   │
│ AN ACTIVE AREA FOR A SENSE LINE CONTACT IN A SECOND     │
│ SENSE LINE                                              │
└─────────────────────────────────────────────────────────┘

┌─────────────────────────────────────────────────────────┐
│ REMOVING A PORTION OF A MASK MATERIAL CORRESPONDING TO  │─ 736
│ THE SENSE LINE CONTACT PATTERN TO FORM SENSE LINE       │
│ CONTACTS                                                │
└─────────────────────────────────────────────────────────┘

┌─────────────────────────────────────────────────────────┐
│ FORMING A MASK MATERIAL OVER ACTIVE AREAS OF SENSE LINE │─ 840
│ CONTACTS FOR SEMICONDUCTOR STRUCTURES ON A SUBSTRATE    │
└─────────────────────────────────────────────────────────┘

┌─────────────────────────────────────────────────────────┐
│ PATTERNING THE MATERIAL ALONG A PATH OF ACTIVE AREAS    │─ 842
│ FOR SENSE LINE CONTACTS AT AN ANGLE TO A SENSE LINE     │
│ DIRECTION                                               │
└─────────────────────────────────────────────────────────┘

┌─────────────────────────────────────────────────────────┐
│ USING A FIRST ETCH TO REMOVE A PORTION OF THE MATERIAL  │
│ CORRESPONDING TO THE PATTERN OF ACTIVE AREAS            │─ 844
│ FOR SENSE LINE CONTACTS TO FORM SENSE LINE CONTACTS     │
└─────────────────────────────────────────────────────────┘

CONTACT PATTERNING

TECHNICAL FIELD

The present disclosure relates generally to semiconductor devices and methods, and more particularly to patterning a material.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a substrate. Such openings may contain, or be associated with, various materials that contribute to data access, storage, and/or processing, or to various support structures, on the memory device. As an example, capacitor material may be deposited into these openings to provide the data access, storage, and/or processing.

As design rules scale to smaller dimensions, a margin to pattern, etch, and form contacts between neighboring memory cells becomes more difficult. For example, etching to form such an opening at smaller dimensions may require precise patterning techniques. A mask material can be deposited on a substrate. A photolithographic technique can be used to pattern the mask material. In some examples, the mask material can be patterned using double pitch photolithography. A mask material may experience multiple cycles of double pitch photolithography which can result in a cross pattern on the mask material where the cross pattern intersects at sense line contacts.

The present disclosure includes methods, apparatuses, and systems related to forming openings to an active area of a sense line contact through patterning a mask material for sense line contact formation at an angle to a sense line direction. An example of a method described herein includes deposition of a mask material over a substrate. The example method further includes patterning and etching the masked material to expose active areas to sense line contacts.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 202 may reference element "02" in FIG. 2, and a similar element may be referenced as 302 in FIG. 3.

Figure 1:
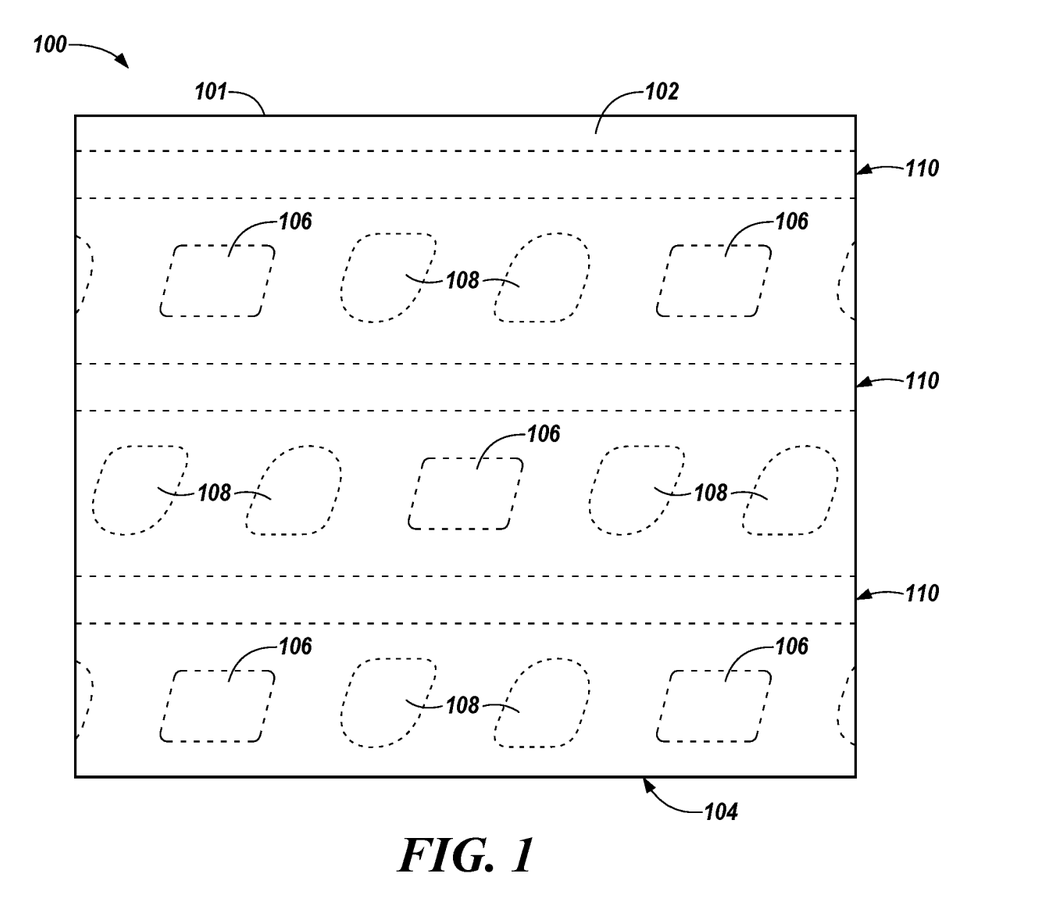
FIGS. 1-6 illustrate top-down views of a portion of an example memory device at various points in time in an example fabrication sequence for patterning a material over an active area for a sense line contact in accordance with a number of embodiments of the present disclosure.

FIG. 1 illustrates a top-down view of a portion of an example memory device 101 at a particular stage in an example semiconductor fabrication sequence for patterning a material over an active area for a sense line contact in accordance with a number of embodiments of the present disclosure. The fabrication sequence illustrated in FIG. 1 is shown at a point 100 in time that corresponds to various processing activities already having been performed in the fabrication sequence.

A mask material 102 may be formed over a substrate 104 of a memory device 101. Semiconductor structures formed on a substrate 104 can include access devices, e.g., transistors, and storage nodes, e.g., capacitor cells, in an example memory array. A dynamic random access memory (DRAM) array is one form of example memory array that can be formed from semiconductor structures fabricated through a semiconductor fabrication process to a substrate on a wafer. The memory array may have an of array of access devices and storage nodes forming memory cells at the intersection of rows and columns. An access line, e.g., wordline (WL), may be used to activate an access device, e.g., metal oxide semiconductor field effect transistor (MOSFET), to access, e.g., turn "on" or "off" access, to the storage node, e.g., capacitor cell, of a memory cell. A sense line, e.g., bit line (BL) may be used to read and/or program, e.g., write, refresh, erase, etc. to and/or from a storage node of the memory cells.

Word lines 110, active areas for sense line contacts 106, and active areas for capacitor cell contacts 108 may be formed on an underlying substrate material 104. The substrate material 104 may be formed from various undoped or doped materials on which various other materials may be deposited, masked, etched, etc., to form semiconductor structures thereon. Examples of a relatively inert undoped substrate material may include monocrystalline silicon (monosilicon), polycrystalline silicon (polysilicon), and amorphous silicon, among other possibilities.

A number of materials may be formed on the substrate 104 before and/or after the mask material 102 is formed. One such material may be a dielectric anti-reflective coating (DARC). DARC may be a type of optical coating to reduce reflection. Another such material may be a carbon-based material which may serve as a hard mask layer.

Figure 2:
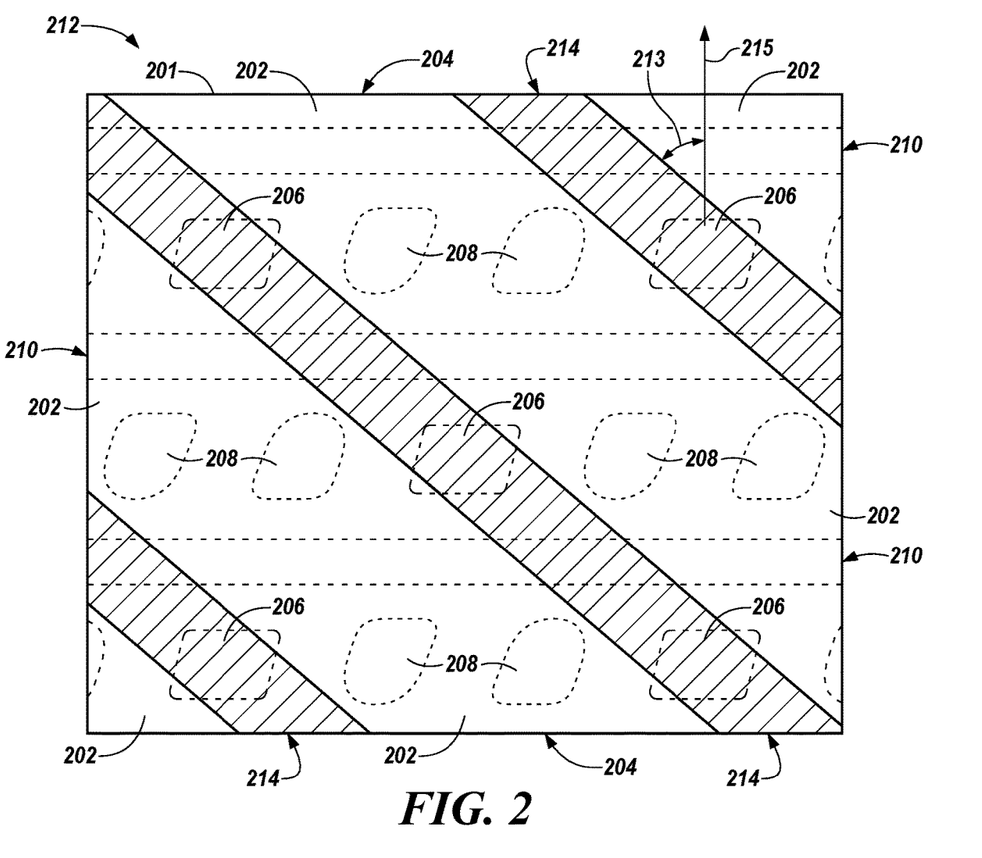

FIG. 2 illustrates a top-down view of a portion of an example memory device 201 at a particular stage in an example semiconductor fabrication sequence for patterning a material over an active area for a sense line contact in accordance with a number of embodiments of the present disclosure. The fabrication sequence illustrated in FIG. 2 is shown at a point 212 in time that corresponds to various processing activities already having been performed in the fabrication sequence.

The point 212 in time of the fabrication sequence illustrated in FIG. 2 shows that the mask material 202 has been patterned. The pattern 214 can be formed using a photolithographic technique. The mask material 202 can be patterned along a path connecting active areas for sense line contacts 206 in a direction different from an intended path, e.g., direction, for sense line formation, e.g., a sense line direction, illustrated by arrow 215. By patterning along a path connecting active areas for sense line contacts 206 in a direction different from intended sense line column formation, e.g., sense line direction, the mask material 202 is patterned at an angle 213 to a sense line direction 215. As used here, the term sense line direction 215 is intended to refer to an orientation of the sense line, e.g., direction relative to other semiconductor structures, on the semiconductor die, e.g., on a wafer, upon which fabrication of semiconductor structures is performed. For example, as illustrated in FIG. 2, a sense line direction 215 for orientation of sense line columns is intended to be orthogonal to an orientation, e.g., direction, of access lines 210, e.g., word lines, formed on the semiconductor die, e.g., on a wafer, upon which fabrication of semiconductor structures is performed. The path creating the angle to the sense line direction may be formed along a path between an active area for a sense line contact in one sense line column and an active area for a sense line contact in a different sense line column. The columns may be adjacent to each other.

As semiconductor fabrication design rules scale to smaller and smaller dimensions on a semiconductor die, e.g., on a wafer during fabrication, a margin for patterning to connect active areas for sense line contacts along a sense line direction, e.g., within a sense line column, may be more difficult without unintended and/or undesired patterning and etching over a portion of active areas of other cell contacts, e.g., capacitor cell regions 208. For example, if the pattern 214 were formed in a direction along the intended sense line direction 215, the etching process to remove material to form sense line contacts may impinge upon a portion of the active areas to capacitor cell regions 208 due to the illustrated, reduced design rule margin. According to an embodiment, as shown in FIG. 2, the sense line contact mask pattern path 214, formed at an angle to the intended sense line direction 215, does not pattern the portion of the mask material 202 over the active areas of the capacitor cell contacts 208. Therefore, in a subsequent etch process to form sense line contacts to the active areas for sense line contacts 206 will not be impinged during an etch process.

Figure 3:
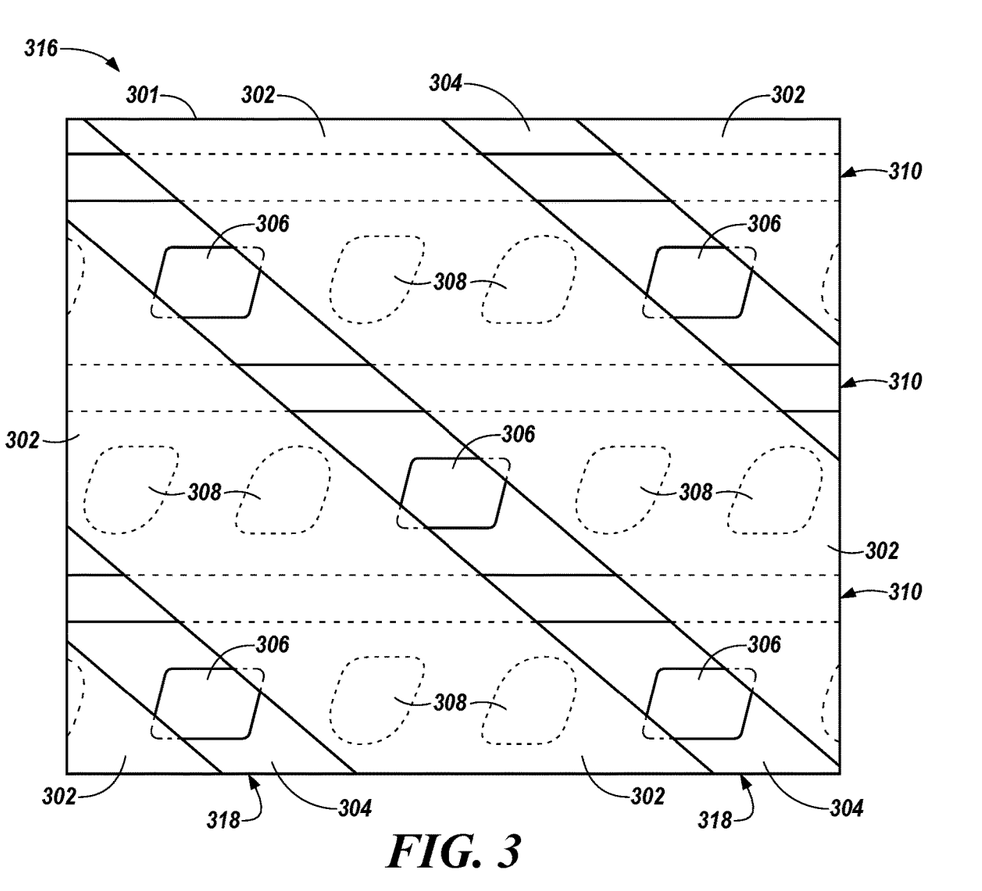

FIG. 3 illustrates a top-down view of a portion of an example memory device 301 at a particular stage in an example semiconductor fabrication sequence for patterning a material over an active area for a sense line contact in accordance with a number of embodiments of the present disclosure. The fabrication sequence illustrated in FIG. 3 is shown at a point 316 in time that corresponds to various processing activities already having been performed in the fabrication sequence.

The point 316 in time shows the that the mask material 304 has been etched. Etching is a process to chemically remove different semiconductor materials selectively and/or non-selectively from among different portions of semiconductor structures on a substrate during the fabrication process. Two types of etchants are liquid-phase (wet) and plasma-phase (dry). Wet etching uses etchants in liquid form. During a wet etch, a wafer, e.g., a silicon wafer forming a substrate and upon which semiconductor structures are formed, can be immersed in a bath of etchant and agitated to achieve good process control. For example, buffered hydrofluoric acid (BHF) can be used to etch silicon dioxide over a silicon substrate. As an alternative to immersion, certain semiconductor fabrication tools and equipment, e.g., a semiconductor processing chamber housing a substrate material, may employ a gas to cushion and protect one side of the wafer while an etchant is applied to the other side.

Plasma etching tools and equipment can operate in several modes by adjusting the parameters of a plasma gas applied to a wafer undergoing a fabrication process. The plasma produces energetic free radicals, neutrally charged, that react at the surface of the wafer. In a plasma etch, neutral particles attack the wafer from all angles. The source gas for the plasma usually contains small molecules rich in chlorine or fluorine.

The pattern may be etched to remove a portion of the mask material 302 and form an opening to active areas for sense line contacts 306. After etching the portion of the mask material 302 to from the active areas for the sense line contacts 306, a portion of the mask material 302 may remain over a portion of the active areas for the sense line contacts 306. A second etch may be used to remove this remaining portion of the mask material 302 from over the active areas for the sense line contacts 306. The portion of the mask material 302 over the active areas for the capacitor cell contacts 308 may protect the capacitor cell during this process, e.g. may not be patterned and etched.

Figure 4:
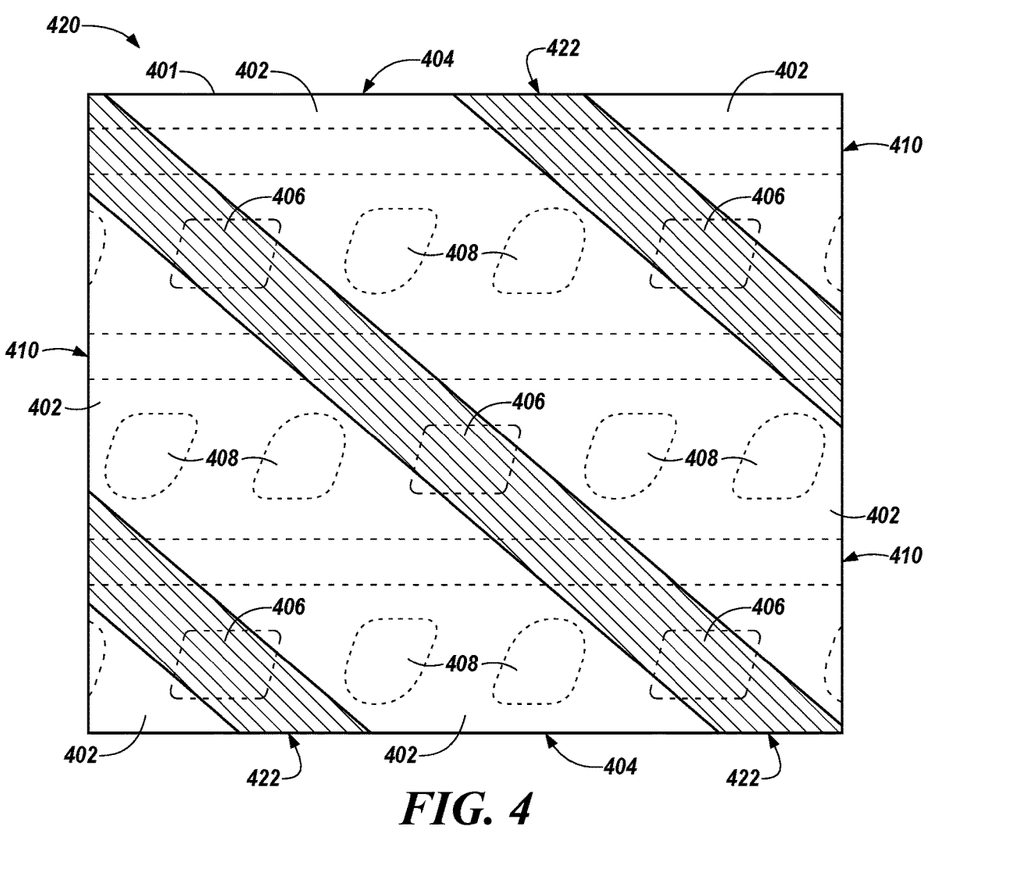

FIG. 4 illustrates a top-down view of a portion of an example memory device 401 at a particular stage in an example semiconductor fabrication sequence for patterning a material over an active area for a sense line contact in accordance with a number of embodiments of the present disclosure. The fabrication sequence illustrated in FIG. 4 is shown at a point 420 in time that corresponds to various processing activities already having been performed in the fabrication sequence.

The point 420 in time shows that the openings formed by etching a portion of the mask material 402 have been filled in using a conductive fill 422. The conductive fill 422 may be formed from a conductive material such as doped polysilicon. The portion of the mask material 402 over the active areas for the capacitor cell contacts 408 may serve as a barrier between the conductive fill 422 and the active areas for the capacitor cell contacts 408.

Figure 5:
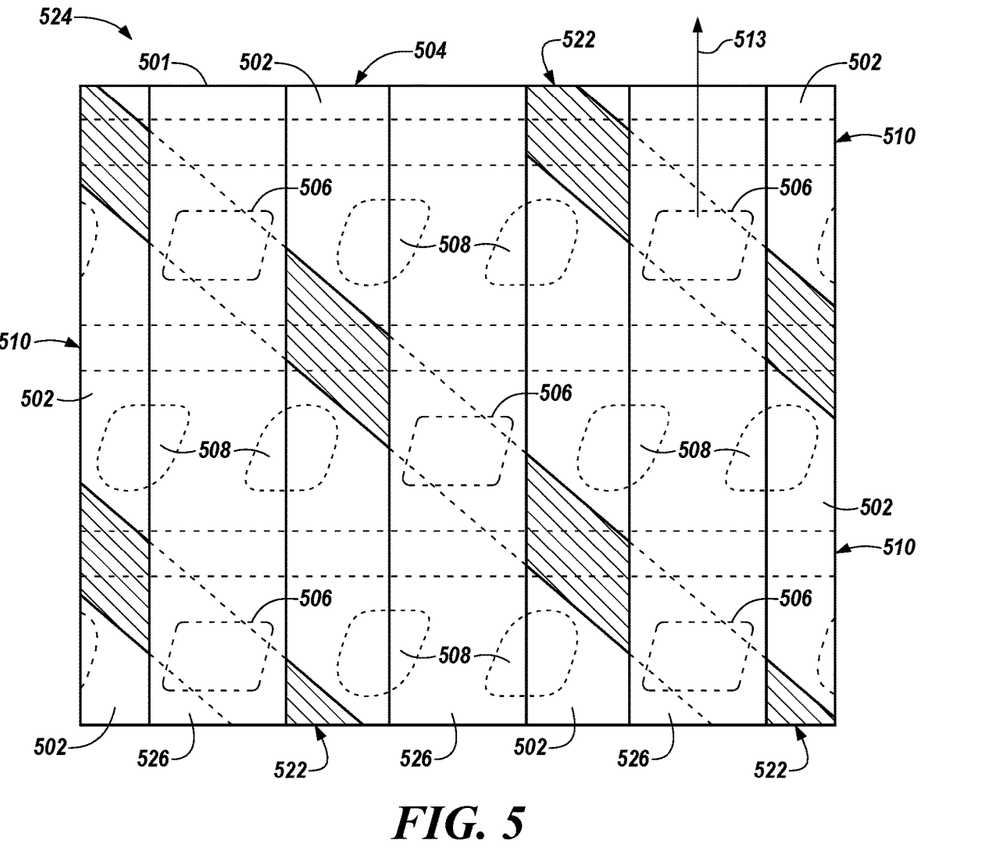

FIG. 5 illustrates a top-down view of a portion of an example memory device 501 at a particular stage in an example semiconductor fabrication sequence for patterning a material over an active area for a sense line contact in accordance with a number of embodiments of the present disclosure. The fabrication sequence illustrated in FIG. 5 is shown at a point 524 in time that corresponds to various processing activities already having been performed in the fabrication sequence.

The point 524 in time shows a memory device 501 featuring a masking material 502 over a substrate 504, as well as the deposition of a sense line stack 526. The sense line stack 526 may be formed in a sense line direction, as illustrated by arrow 513. The sense line direction may be the direction in which the sense line stacks 526 are deposited. The sense line direction may be the same for every sense line in a sense line column. As illustrated in FIG. 5, in an embodiment the sense line stack 526 may be formed to cover a full contour of the sense line contacts. Forming the sense line stack 526 to cover a full contour of an active area for a sense line contact 506 may allow the sense line to use the full active area for a sense line contact 506 as a sense line contact. The sense line stack 526 may be comprised of conductive materials and dielectric materials. The portion of the conductive fill 522 between the sense line stacks 526 may be removed subsequent to the deposition of the sense line stacks 526.

Figure 6:
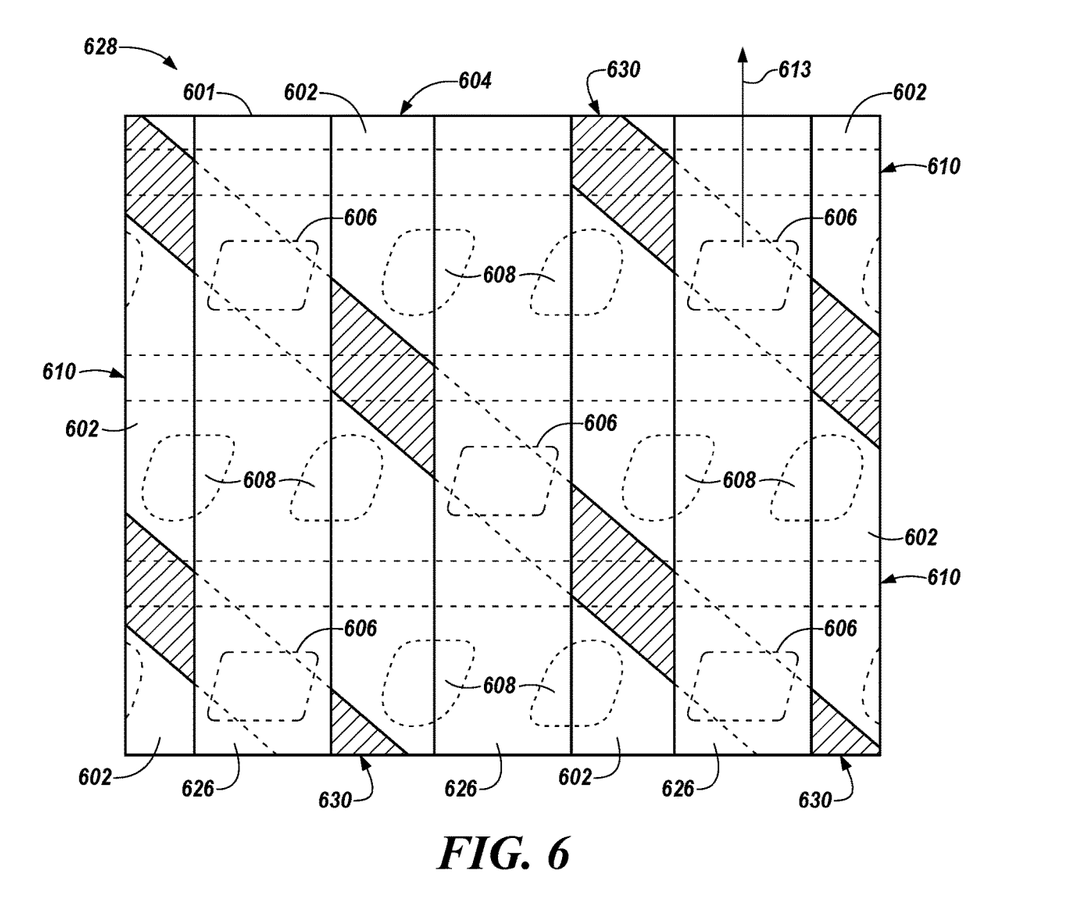

FIG. 6 illustrates a top-down view of a portion of an example memory device 601 at a particular stage in an example semiconductor fabrication sequence for patterning a material over an active area for a sense line contact in accordance with a number of embodiments of the present disclosure. The fabrication sequence illustrated in FIG. 6 is shown at a point 628 in time that corresponds to various processing activities already having been performed in the fabrication sequence.

The point 628 in time shows the deposition of a dielectric material 630. An etch may be performed to expose an opening between the sense line columns 626 in the sense line direction 613 to isolate the sense line columns 626. This etch may be a wet etch. After performing the etch, a dielectric material 630 may be used to fill in and electrically isolate the sense line columns from each other. Depositing a dielectric material 630 may prevent the sense line columns from communicating with each other.

The dielectric material 630 can be formed from a material that is an insulator such as a nitride. A nitride material may be formed from a nitride material selected for dielectric or resistance properties. For example, one or more dielectric materials and/or nitrides may be selected from boron nitride (BN), silicon nitride ($SiN_X$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the dielectric material 630.

Figure 7:
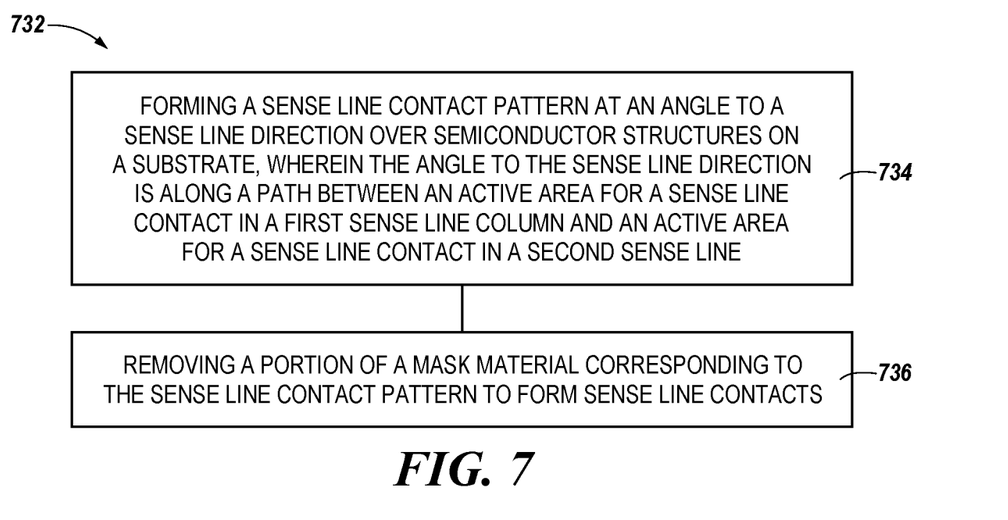
FIGS. 7-9 are flow diagrams of example methods for patterning a material over an active area for sense line contact in accordance with a number of embodiments of the present disclosure.

FIG. 7 is a flow diagram of an example method 732 for patterning a material over an active area for a sense line contact in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 734, the method 732 may include forming a sense line contact pattern at an angle to a sense line direction over semiconductor structures on a substrate. The method 732 may further include forming the angle to the sense line direction along a path between an active area for a sense line contact in a first sense line column and an active area for a sense line contact in a second sense line column.

At block 736, the method 732 may include removing a portion of a mask material corresponding to the active area for a sense line contact pattern to form sense line contacts. The portion of the mask material may be removed by etching the portion of the mask material that was patterned.

Figure 8:
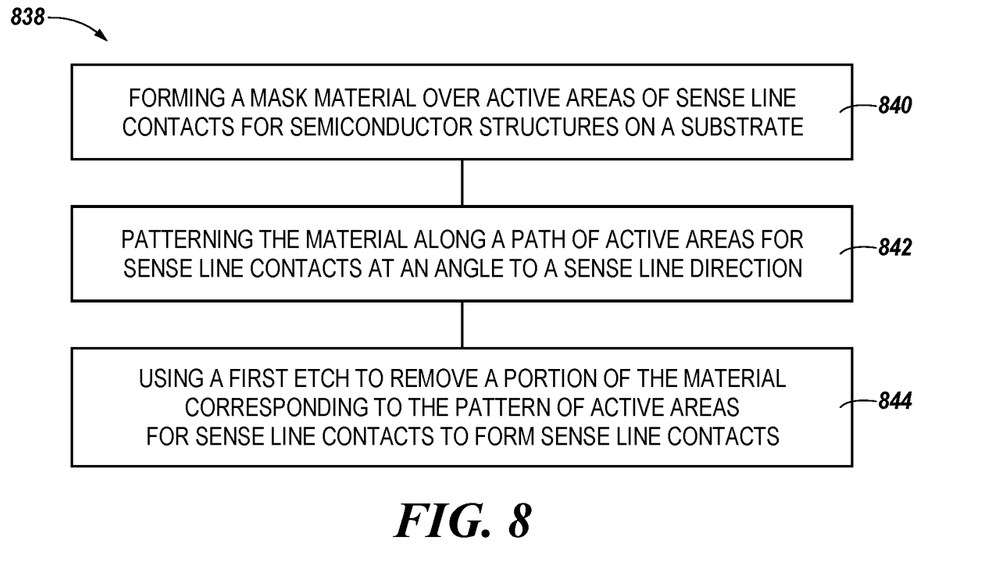

FIG. 8 is a flow diagram of another example method 838 for patterning a material over an active area for a sense line contact in accordance with a number of embodiments of the present disclosure.

At block 840, the method 838 may include forming a mask material over active areas of sense line contacts for semiconductor structures on a substrate. The mask material may be formed out of silicon oxide. The method 838 may, in a number of embodiments, include forming multiple mask materials. A number of the multiple mask materials may be hard mask layers.

At block 842, the method 838 may include patterning the mask material along a path of active areas for sense line contacts at an angle to a sense line direction. The mask material may be patterned using photolithographic techniques. At block 844, method 838 may include using a first etch to remove a portion of the mask material corresponding to the pattern of active areas for sense line contacts to form sense line contacts. After performing the first etch, a portion of the mask material may remain over the active area for a sense line contact. A second etch may be used to remove the remaining portion of the mask material over the active area for a sense line contact.

Figure 9:
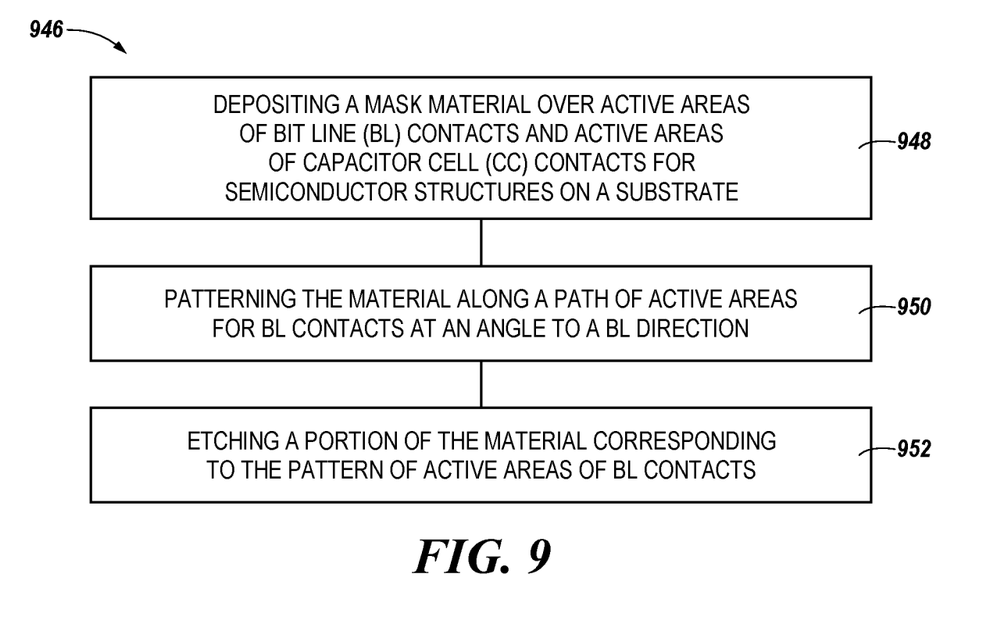

FIG. 9 is a flow diagram of another example method 946 for patterning a material over an active area for a sense line contact in accordance with a number of embodiments of the present disclosure.

At block 948, the method 946 may include depositing a mask material over active areas of bit line (BL) contacts and active areas of capacitor cell (CC) contacts for semiconductor structures on a substrate. At block 950, the method 946 may include patterning the material along a path of active areas for BL contacts at an angle to a BL direction. The path of active areas for BL contacts may include active areas for BL contacts from distinct BL columns. By patterning along this path of active areas for BL contacts, the subsequent etch may expose a larger portion of the active area for a BL contact than if the mask material was patterned in correspondence with the BL contact direction. This may allow for the mask material to be patterned and etched through a single use of a photolithographic technique instead of through multiple uses of a photolithographic technique. At block 952, the method 946 may include etching a portion of the mask material corresponding to the pattern of active areas of BL contacts.

Figure 10:
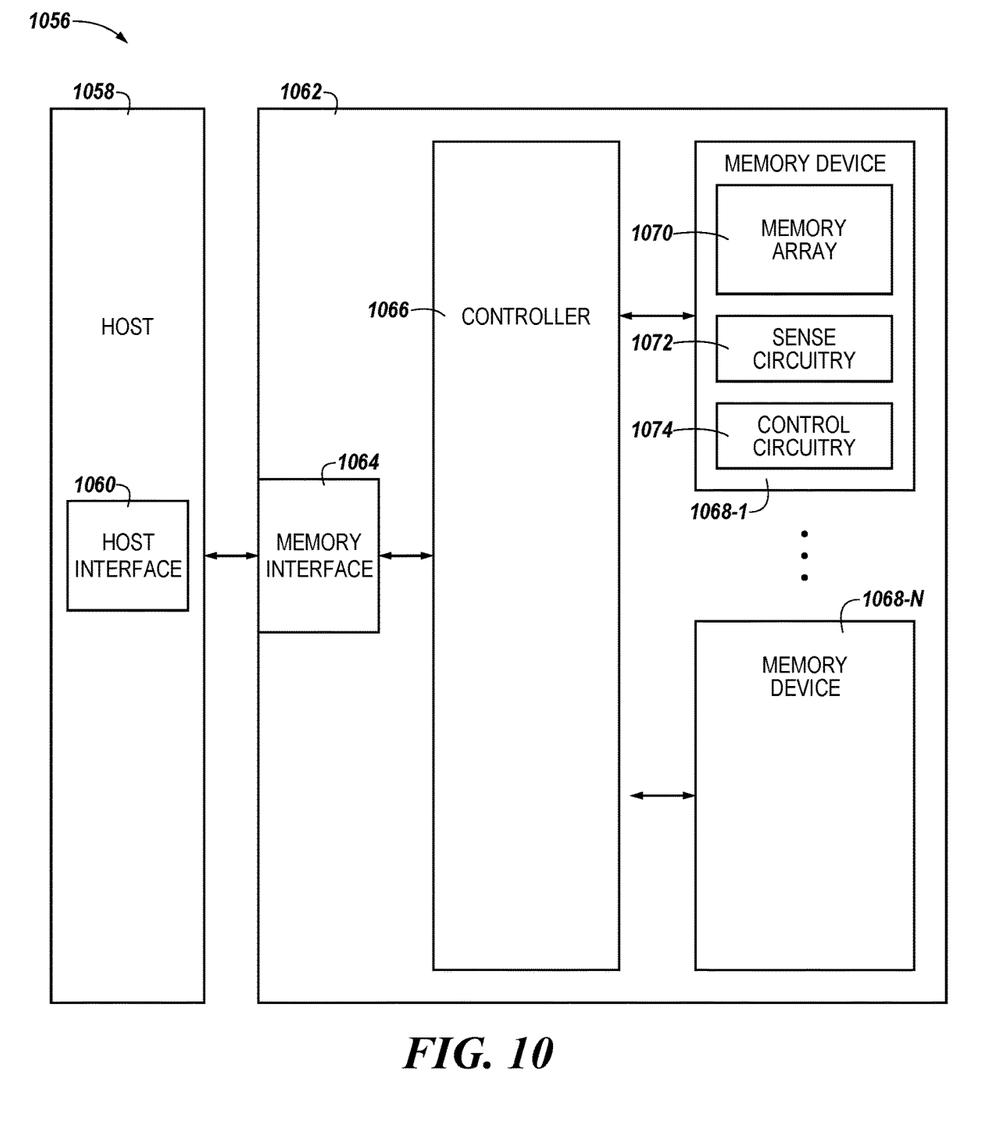
FIG. 10 is a functional block diagram of a computing system including at least one memory system in accordance with a number of embodiments of the present disclosure.

FIG. 10 is a functional block diagram of a computing system 1056 including at least one memory system 1062 in accordance with one or more embodiments of the present disclosure. The numbering convention used in connection with FIG. 10 does not follow the earlier introduced numbering convention and sequence that applies to FIGS. 1-9. Memory system 1062 may be, for example, a solid-state drive (SSD).

In the embodiment illustrated in FIG. 10, memory system 1062 includes a memory interface 1064, a number of memory devices 1068-1, . . . , 1068-N, and a controller 1066 selectably coupled to the memory interface 1064 and memory devices 1068-1, . . . , 1068-N. Memory interface 1064 may be used to communicate information between memory system 1062 and another device, such as a host 1058. Host 1058 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, PDAs, memory card readers, interface hubs, and the like. Such a host 1058 may be associated with fabrication operations performed on semiconductor devices and/or SSDs using, for example, a processing apparatus shown at 251 and described in connection with FIG. 2.

In a number of embodiments, host 1058 may be associated with (e.g., include or be coupled to) a host interface 1060. The host interface 1060 may enable input of scaled preferences (e.g., in numerically and/or structurally defined gradients) to define, for example, critical dimensions (CDs) of a final structure or intermediary structures of a memory device (e.g., as shown at 1068) and/or an array of memory cells (e.g., as shown at 1070) formed thereon to be implemented by the processing apparatus 251. The scaled preferences may be provided to the host interface 1060 via input of a number of preferences stored by the host 1058, input of preferences from another storage system (not shown), and/or input of preferences by a user (e.g., a human operator).

Memory interface 1064 may be in the form of a standardized physical interface. For example, when memory system 1062 is used for information (e.g., data) storage in computing system 1056, memory interface 1064 may be a serial advanced technology attachment (SATA) interface, a peripheral component interconnect express (PCIe) interface, or a universal serial bus (USB) interface, among other physical connectors and/or interfaces. In general, however, memory interface 1064 may provide an interface for passing control, address, information, scaled preferences, and/or other signals between the controller 1066 of memory system 1062 and a host 1058 (e.g., via host interface 1060).

Controller 1066 may include, for example, firmware and/or control circuitry (e.g., hardware). Controller 1066 may be operably coupled to and/or included on the same physical device (e.g., a die) as one or more of the memory devices 1068-1, . . . , 1068-N. For example, controller 1066 may be, or may include, an ASIC as hardware operably coupled to circuitry (e.g., a printed circuit board) including memory interface 1064 and memory devices 1068-1, . . . , 1068-N. Alternatively, controller 1066 may be included on a separate physical device that is communicatively coupled to the physical device (e.g., the die) that includes one or more of the memory devices 1068-1, . . . , 1068-N.

Controller 1066 may communicate with memory devices 1068-1, . . . , 1068-N to direct operations to sense (e.g., read), program (e.g., write), and/or erase information, among other functions and/or operations for management of memory cells. Controller 1066 may have circuitry that may include a number of integrated circuits and/or discrete components. In a number of embodiments, the circuitry in controller 1066 may include control circuitry for controlling access across memory devices 1068-1, . . . , 1068-N and/or circuitry for providing a translation layer between host 1058 and memory system 1062.

Memory devices 1068-1, . . . , 1068-N may include, for example, a number of memory arrays 1070 (e.g., arrays of volatile and/or non-volatile memory cells). For instance, memory devices 1068-1, . . . , 1068-N may include arrays of memory cells, such as a portion of an example memory device 1176 structured to include sense line contacts described in connection with FIGS. 1-9. As will be appreciated, the memory cells in the memory arrays 1070 of memory devices 1068-1, . . . , 1068-N and/or as shown at 1176 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 1068, 1176 may be formed on the same die. A memory device (e.g., memory device 1068-1) may include one or more arrays 1070 of memory cells formed on the die. A memory device may include sense circuitry 1072 and control circuitry 1074 associated with one or more arrays 1070 formed on the die, or portions thereof. The sense circuitry 1072 may be utilized to determine (sense) a particular data value (e.g., 0 or 1) that is stored at a particular memory cell in a row of an array 1070. The control circuitry 1074 may be utilized to direct the sense circuitry 1072 to sense particular data values, in addition to directing storage, erasure, etc., of data values in response to a command from host 1058 and/or host interface 1060. The command may be sent directly to the control circuitry 1074 via the memory interface 1064 or to the control circuitry 1074 via the controller 1066.

The embodiment illustrated in FIG. 10 may include additional circuitry that is not illustrated so as not to obscure embodiments of the present disclosure. For example, memory devices 1068, 1176 may include address circuitry to latch address signals provided over I/O connectors through I/O circuitry. Address signals may be received and decoded by a row decoder and a column decoder to access a memory array 1070. It will be appreciated that the number of address input connectors may depend on the density and/or architecture of memory devices 1068, 1176 and/or memory arrays 1070.

Figure 11:
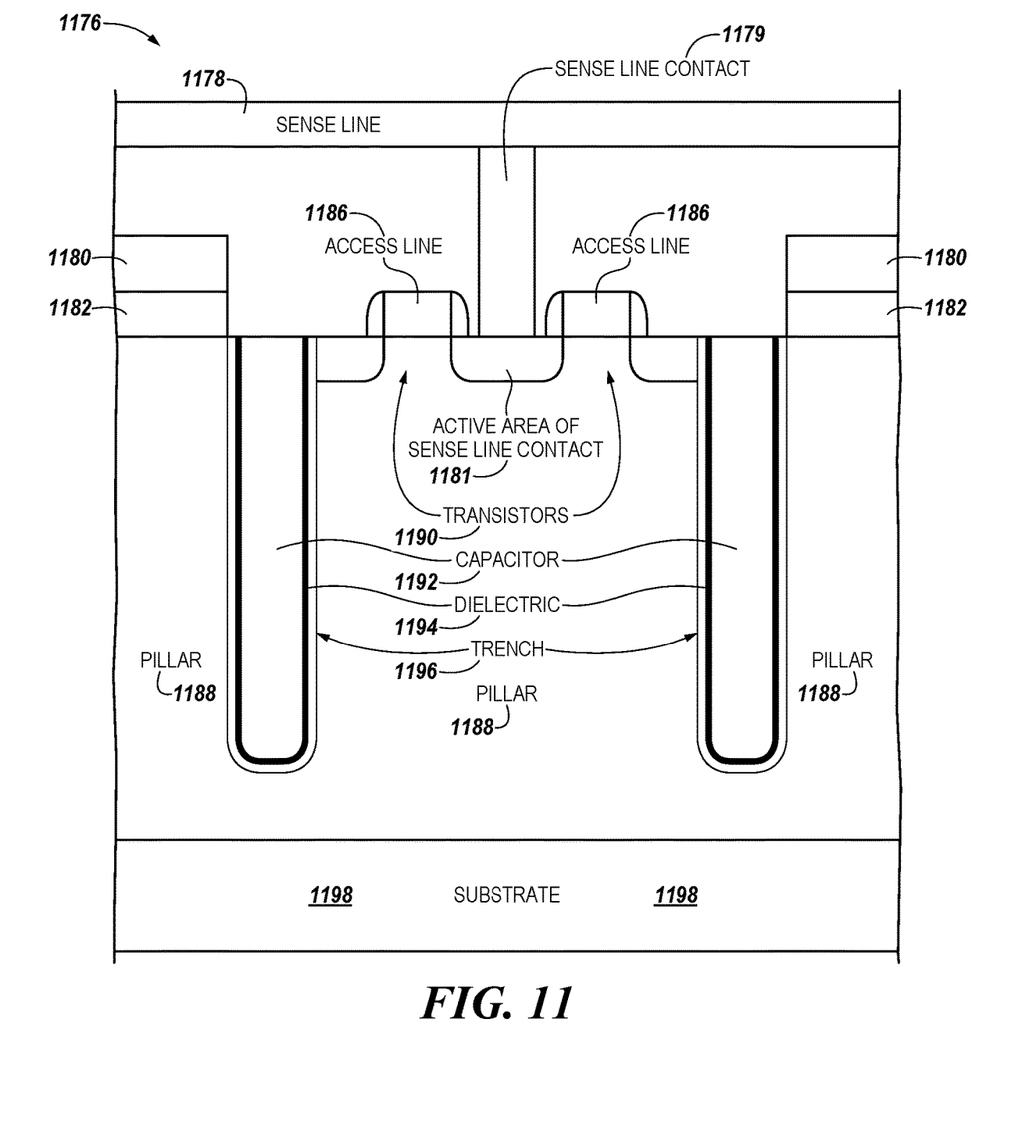
FIG. 11 illustrates a cross-sectional view of a portion of an example of semiconductor structures of a memory device that include sense line contacts to sense lines formed in accordance with a number of embodiments of the present disclosure.

FIG. 11 illustrates a cross-sectional view of a portion of an example of semiconductor structures of a memory device 1076 that include sense line contacts to sense lines formed in accordance with a number of embodiments of the present disclosure. The numbering convention used in connection with FIG. 11 does not follow the earlier introduced numbering convention and sequence that applies to FIGS. 1-9. The portion of the memory device 1076 illustrated in FIG. 11 is shown by way of example and not by way of limitation to include a DRAM memory cell architecture. Another RAM, flash (e.g., NAND or NOR), and/or 3D memory cell architecture also may include pillars and adjacent trenches. Embodiments are not so limited. Although the DRAM transistors 1190 and capacitors 1192 are shown to be arranged in a lateral configuration, embodiments may include the transistors 1190 and capacitors 1192 being arranged in a lateral, a vertical, or any other configuration.

The portion of the memory device 1076 shown in FIG. 11 may represent two DRAM memory cells in a 1T1C (one transistor one capacitor) configuration or one DRAM memory cell in a 2T2C configuration. DRAM memory cells may utilize capacitors 1192 each formed in a trench 1196 to store a particular charge corresponding to a data value. Forming the trenches 1196 as shown in FIG. 11 may result in a pillar 1188 being formed from the etched material on each side of a trench 1196. Pillars 1188 may be formed (e.g., fabricated) as layers of doped or undoped semiconductor material deposited on a substrate material 1198. The semiconductor material may be etched to form the pillars 1188 and trenches 1196. In some embodiments, an opening (e.g., a round, square, oblong, etc., opening rather than a rectilinear trench) may be etched into the semiconductor material and capacitor material may be deposited in the opening, although such a configuration does not affect the concept of passivation material for pillars adjacent a trench described herein.

Moreover, embodiments of the present disclosure are not limited to capacitors being formed in a trench for data storage, nor are embodiments limited to the trench containing capacitor material. For example, various types of memory devices may include trenches between sidewall structures (e.g., pillars) in which various materials may be positioned to contribute to data access, storage, and/or processing or in which various materials may be formed for electrical conduction and/or isolation (e.g., conductor, resistor, and/or dielectric materials), among other functions and/or operations.

In a number of embodiments, a trench 1196 may be etched to a particular depth into a pillar material. The trench 1196 may be etched into the material of the pillars 1188 to a depth approaching the substrate material 1198, as shown in FIG. 11. Alternatively, the trench 127 may be etched into the material of the pillars 125 to a top of or into the substrate material 123, as shown in FIG. 1. The depth of the trench 127, 1196 approaching, at the top of, and/or into the substrate material 123, 1198 is termed herein as being in the bottom region of the trench.

As described herein, deepening (e.g., etching) the trench further into the pillar material or the substrate material, formed according to embodiments described in FIGS. 1-9, may increase a surface area of the trench boundaries. In one example, increasing the surface area of the trench boundaries may increase a capacitance of a capacitor 1192 formed in the trench 1196 (e.g., by increasing a volume and/or surface area of the capacitor). In this example, the trench 1196 may be lined with a dielectric material 1194 and a capacitor material may be formed (e.g., deposited) within the trench 1196 and on the dielectric material 1194 to form the capacitor 229 to a particular (e.g., target) depth.

Each pillar 1188 of the pillar material may extend to a particular height (e.g., as shown at 132 and described in connection with FIG. 1) above the substrate material 1198. As such, each pillar 1188 has a top surface 1126 at the particular height. A number of structural materials may be formed on or in association with the top surface 1126 of the pillar 1188 adjacent the trench 1196. For example, a particular material 1182 may be formed to contribute to data access, storage, and/or processing (e.g., conductor, resistor, and/or dielectric materials). Such a material 1182 may be formed on the top surface 1126 of the pillar 1188 adjacent the trench 1196. A mask material 1180 may be formed to protect an underlying material 1182 and/or the top surface 1126 of the pillar 1188 adjacent the trench 1196 from subsequent processing and/or wear encountered in use of the memory device 1076. Other structural materials that may be formed (e.g., in a DRAM configuration as shown in FIG. 11) on or in association with the top surface 1126 of the pillar 1188 adjacent the trench 1196. The other structural materials may include the transistors 1190, access lines 1186, and/or sense lines 1078, among other possible structural materials. The structural materials just described as being formed on and/or in association with the top surface 1126 of the pillar 1188 adjacent the trench 1196 are termed herein as being in a top region of the pillar 1188 and/or trench 1196.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, openings, among other materials and/or components related to patterning a material over an active area for a sense line contact, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to patterning a material over an active area for a sense line contact than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method comprising:
    forming a mask material over active areas of sense line contacts for semiconductor structures on a substrate;
    patterning the mask material at an angle to a sense line direction while not patterning the mask material over any portion of active areas of capacitor cell contacts, wherein:
        the sense line direction is orthogonal to an orientation of access lines;
        the patterned portion of the mask material is above active areas for sense line contacts, wherein the patterned portion of the mask material is a diagonal shape that extends from an active area for a sense line contact in a first sense line column to an active area for a sense line contact in a second sense line column; and
        the first sense line column is adjacent the second sense line column; and
    using a first etch to remove the patterned portion of the mask material to expose the active areas of the sense line contacts.

2. The method of claim 1, further comprising using the first etch to remove the portion of the mask material at the angle to the sense line direction to expose sense line contacts belonging to different sense lines along a direction of the patterned mask material.

3. The method of claim 1, further comprising using a second etch to remove a remaining amount of a material on the active areas of sense line contacts after the first etch.

4. A method comprising:
    depositing a mask material over active areas of bit line (BL) contacts and active areas of capacitor cell (CC) contacts for semiconductor structures on a substrate;
    patterning the mask material at an angle to a BL direction while not patterning the mask material over any portion of the active areas of capacitor cell contacts wherein:
        the BL direction is orthogonal to an orientation of access lines;
        the patterned portion of the mask material is above active areas for BL contacts,
        wherein the patterned portion of the mask material is a diagonal shape that extends from an active area for a first BL contact in a first BL column to a second active area for a BL contact in a second BL column; and
        the first BL column is adjacent the second BL column; and
    etching the patterned portion of the mask material to expose the active areas of the BL contacts.

5. The method of claim 4, further comprising forming the mask material out of silicon oxide.

6. The method of claim 4, further comprising patterning the mask material using a photo mask.

7. The method of claim 4, further comprising using double pitch patterning to pattern the mask material along the path of active areas for bit line contacts.

8. The method of claim 4, further comprising depositing polysilicon into the etched portion of the mask material.

9. The method of claim 4, wherein the access line is a word line.

10. The method of claim 9, further comprising forming a first BL on an active area of a BL contact.

11. The method of claim 9, further comprising forming the first BL to cover a contour of the active area of bit line contact.

12. The method of claim 9, further comprising forming a second BL adjacent to the first BL.

13. The method of claim 12, further comprising depositing a nitride to isolate the first BL from the second BL.

* * * * *